(12) United States Patent
Zhang

(10) Patent No.: US 9,024,698 B2
(45) Date of Patent: May 5, 2015

(54) TEMPERATURE COMPENSATION METHOD AND CRYSTAL OSCILLATOR

(71) Applicant: Huawei Technologies Co., Ltd., Shenzhen, Guangdong (CN)

(72) Inventor: Qiang Zhang, Shanghai (CN)

(73) Assignee: Huawei Technologies Co., Ltd., Shenzhen (CN)

(*) Notice: Subject to any disclaimer, the term of this patent is extended or adjusted under 35 U.S.C. 154(b) by 7 days.

(21) Appl. No.: 14/095,718

(22) Filed: Dec. 3, 2013

(65) Prior Publication Data

US 2014/0184344 A1 Jul. 3, 2014

(30) Foreign Application Priority Data

Dec. 17, 2012 (CN) .......................... 2012 1 0548130

(51) Int. Cl.
    *H03L 1/00* (2006.01)
    *H03L 1/02* (2006.01)
    *H03B 5/36* (2006.01)
    *H03L 1/04* (2006.01)
    *H03B 5/04* (2006.01)

(52) U.S. Cl.
    CPC ............... *H03L 1/022* (2013.01); *H03B 5/364* (2013.01); *H03L 1/04* (2013.01); *H03B 5/04* (2013.01); *H03L 1/027* (2013.01); *H03B 5/36* (2013.01)

(58) Field of Classification Search
    CPC ........... H03L 1/022; H03L 1/04; H03L 1/027; H03B 5/04; H03B 5/364; H03B 5/36

USPC .......................... 331/176, 116 R, 116 FE, 158
See application file for complete search history.

(56) References Cited

U.S. PATENT DOCUMENTS

| | | |
|---|---|---|
| 5,760,656 A | 6/1998 | Sutliff et al. |
| 2002/0173284 A1* | 11/2002 | Forrester ...................... 455/255 |
| 2003/0071696 A1 | 4/2003 | Kubo et al. |
| 2010/0127787 A1 | 5/2010 | Kurogo et al. |
| 2011/0121909 A1 | 5/2011 | Isohata et al. |
| 2013/0321048 A1* | 12/2013 | He ............................... 327/156 |

FOREIGN PATENT DOCUMENTS

CN     102075143 A     5/2011

\* cited by examiner

*Primary Examiner* — Arnold Kinkead
(74) *Attorney, Agent, or Firm* — Leydig, Voit & Mayer, Ltd.

(57) ABSTRACT

Embodiments of the present invention provide a temperature compensation method and a crystal oscillator, where the crystal oscillator includes a crystal oscillation circuit unit, a temperature sensor unit, an oscillation controlling unit, a relative temperature calculating unit, and a temperature compensating unit. The temperature sensor unit measures a measured temperature of the crystal oscillation circuit unit; the relative temperature calculating unit obtains a temperature difference between the measured temperature and a reference temperature; the temperature compensating unit obtains a temperature compensation value corresponding to the temperature difference from a temperature-frequency curve; and the oscillation controlling unit generates a frequency control signal, according to a frequency tracked by a communications AFC device and the temperature compensation value, thereby controlling a frequency of the crystal oscillation circuit unit to work on the tracked frequency.

14 Claims, 3 Drawing Sheets

TEMPERATURE COMPENSATION METHOD AND CRYSTAL OSCILLATOR

CROSS-REFERENCE TO RELATED APPLICATION

This application claims priority to Chinese Patent Application No. 201210548130.X, filed on Dec. 17, 2012, which is hereby incorporated by reference in its entirety.

TECHNICAL FIELD

Embodiments of the present invention relate to the field of electronic device technologies, and in particular, to a temperature compensation method and a crystal oscillator.

BACKGROUND

An existing solution of a temperature compensation oscillator system consists of a crystal oscillator module, a temperature sensor module, a temperature compensation processing module, and an oscillator controlling module, where the crystal oscillator module consists of an oscillator module and a quartz crystal (crystal).

In the temperature sensor module close to the quartz crystal, a negative temperature coefficient thermistor senses a change in temperature and converts the temperature into a voltage signal, which is then converted into a numerical signal in the temperature sensor module. A temperature signal in a digital form is input into the temperature compensation processing module; the temperature compensation processing module converts, according to a temperature-frequency curve of the crystal oscillator module, the temperature signal into a control signal, which is input into the oscillator controlling module together with an automatic frequency control signal required by a communications system, thereby controlling an oscillation frequency of the crystal oscillator. The crystal oscillator module, temperature sensor module, temperature compensation processing module, and oscillator controlling module form an integral digital-controlled crystal oscillator (DCXO).

When the existing digital-controlled crystal oscillator works normally, accuracy of a temperature measurement value of the temperature sensor as well as correctness of the temperature-frequency curve in the temperature compensation processing module need to be ensured, so that the temperature compensation processing module can output a correct temperature compensation value. However, in large-scale applications, temperature sensors are discrete, and temperature-frequency curves of crystal oscillators are also discrete, which require calibration. Such calibration in a wide temperature range greatly affects the time and production cost in mass production.

SUMMARY

Embodiments of the present invention provide a temperature compensation method and a crystal oscillator, which can reduce the cost for temperature compensation calibration.

In a first aspect, a crystal oscillator is provided, where the crystal oscillator includes a crystal oscillation circuit unit, a temperature sensor unit, an oscillation controlling unit, a relative temperature calculating unit, and a temperature compensating unit. The temperature sensor unit is configured to measure a measured temperature of the crystal oscillation circuit unit; the relative temperature calculating unit is configured to obtain a temperature difference between the measured temperature and a reference temperature, where the reference temperature is a measured value of the crystal oscillation circuit unit at normal temperature; the temperature compensating unit is configured to obtain a temperature compensation value corresponding to the temperature difference from a temperature-frequency curve; and the oscillation controlling unit is configured to generate a frequency control signal according to a frequency tracked by a communications adaptive frequency control AFC device and the temperature compensation value, and use the frequency control signal to control an oscillation frequency of the crystal oscillation circuit unit to work on the frequency tracked by the communications AFC device.

In a first possible implementation manner, with reference to the first aspect, the specific implementation is that, the oscillation controlling unit is specifically configured to determine an AFC control value according to the frequency tracked by the AFC device and a frequency corresponding to the temperature compensation value, and generate the frequency control signal according to the AFC control value and the temperature compensation value.

In a second possible implementation manner, with reference to the first aspect or the first possible implementation manner of the first aspect, the crystal oscillator further includes a sample obtaining unit, configured to, when the oscillation frequency of the crystal oscillation circuit unit works stably on the frequency tracked by the communications AFC device, collect the measured temperature or the temperature difference as a temperature parameter of a sample, and collect the frequency control signal or the frequency tracked by the communications AFC device as a frequency parameter of the sample; and a calibrating unit, configured to calibrate a coefficient of the temperature-frequency curve according to samples collected by the sample obtaining unit multiple times.

In a third possible implementation manner, with reference to the second possible implementation manner of the first aspect, the specific implementation is that, the calibrating unit specifically fits, by using a least square method, the samples collected by the sample obtaining unit multiple times, thereby calibrating the coefficient of the temperature-frequency curve.

In a second aspect, a temperature compensation method is proposed, where the method includes: measuring a measured temperature of a crystal oscillation circuit by using a temperature sensor; obtaining a temperature difference between the measured temperature and a reference temperature, where the reference temperature is a measured value of the crystal oscillation circuit at normal temperature; obtaining a temperature compensation value corresponding to the temperature difference from a temperature-frequency curve; and generating a frequency control signal according to a frequency tracked by a communications adaptive frequency control AFC device and the temperature compensation value, and using the frequency control signal to control an oscillation frequency of the crystal oscillation circuit to work on the frequency tracked by the communications AFC device.

In a first possible implementation manner, with reference to the second aspect, the specific implementation of generating a frequency control signal according to a frequency tracked by a communications adaptive frequency control AFC device and the temperature compensation value is: determining an AFC control value according to the frequency tracked by the AFC device and a frequency corresponding to the temperature compensation value, and generating the frequency control signal according to the AFC control value and the temperature compensation value.

In a second possible implementation manner, with reference to the second aspect or the first possible implementation manner of the second aspect, the method further includes: if the oscillation frequency of the crystal oscillation circuit works stably on the frequency tracked by the communications AFC device, collecting the measured temperature or the temperature difference as a temperature parameter of a sample, and collecting the frequency control signal or the frequency tracked by the AFC device as a frequency parameter of the sample; and calibrating a coefficient of the temperature-frequency curve according to samples collected multiple times.

In a third possible implementation manner, with reference to the second possible implementation manner of the second aspect, the specific implementation of calibrating a coefficient of the temperature-frequency curve according to samples collected multiple times is fitting, by using a least square method, the samples collected multiple times, thereby calibrating the coefficient of the temperature-frequency curve.

According to the technical solutions described above, the temperature compensation method and the crystal oscillator according to the embodiments of the present invention, by obtaining a temperature difference between a measured temperature of a temperature sensor and a reference temperature, and determining a temperature compensation value according to the temperature difference and a coefficient of a temperature-frequency curve to control an oscillation frequency of a crystal oscillation circuit unit, achieve a temperature compensation result to specific precision at a low cost.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
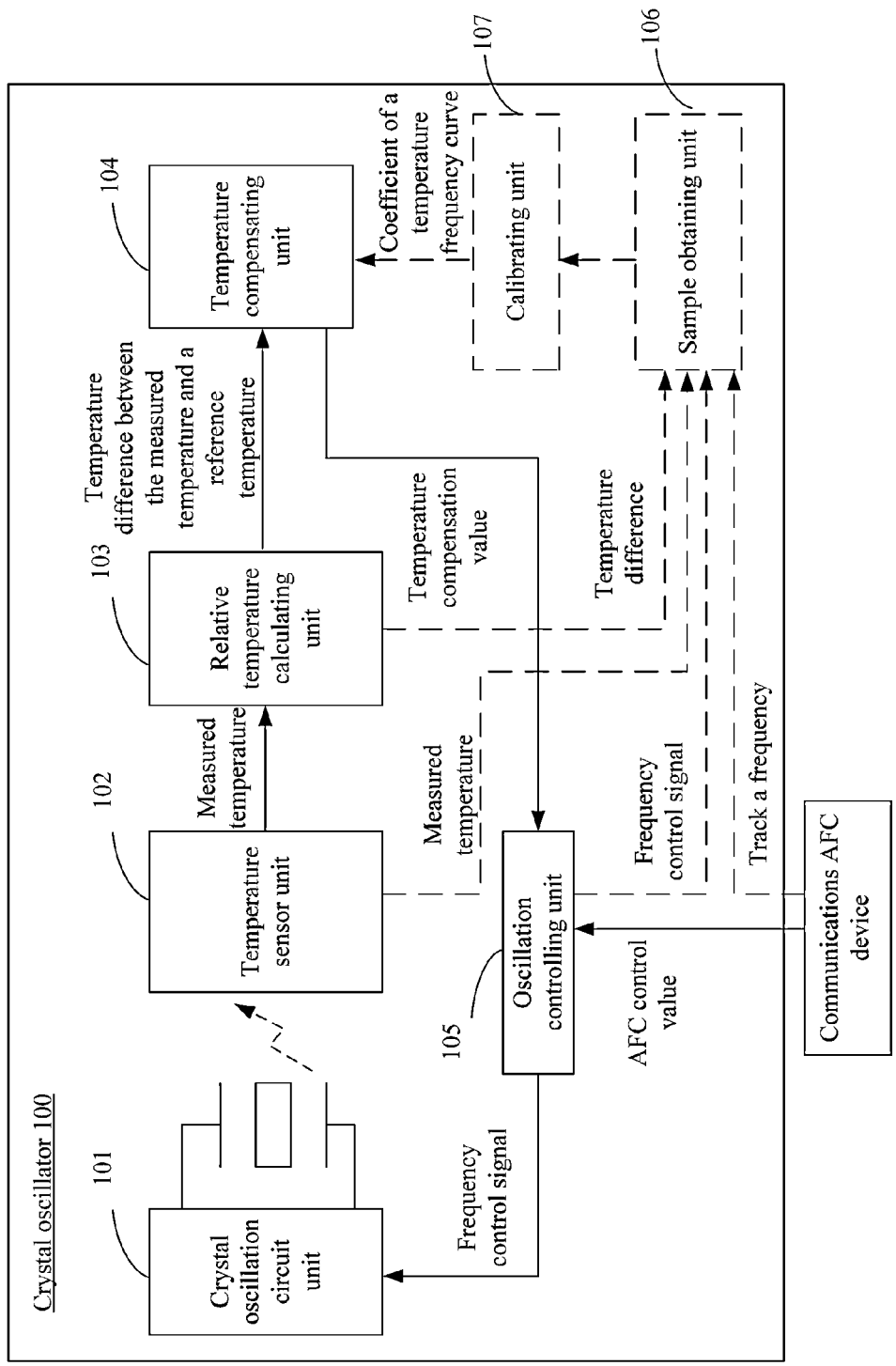
FIG. 1 is a schematic structural diagram of a crystal oscillator according to an embodiment of the present invention.

FIG. 1 is a schematic structural diagram of a crystal oscillator 100 according to an embodiment of the present invention. The crystal oscillator 100 may include a crystal oscillation circuit unit 101, a temperature sensor unit 102, a relative temperature calculating unit 103, a temperature compensating unit 104, and an oscillation controlling unit 105.

The temperature sensor unit 102 may measure a measured temperature of the crystal oscillation circuit unit 101. In the embodiment of the present invention, the measured temperature of the temperature sensor may be a voltage signal or numerical signal representing a temperature value.

The relative temperature calculating unit 103 may be configured to obtain a temperature difference between the measured temperature and a reference temperature. The reference temperature is a measured value of the crystal oscillation circuit unit at normal temperature. The normal temperature mentioned in the embodiments of the present invention refers to a temperature under a common test environment of a product line, which may specifically be a temperature within a range above or below 25° C., but is not 25° C. in the common sense. For example, it may be a temperature from 20° C. to 30° C. Certainly, it may also be a temperature within a larger range, and the present invention sets no limit thereto.

The temperature compensating unit 104 is configured to obtain a temperature compensation value corresponding to the temperature difference from a temperature-frequency curve. The temperature compensation value is a control value of a control signal corresponding to the temperature difference and applied to the oscillation controlling unit 105.

The oscillation controlling unit 105 is configured to generate a frequency control signal according to a frequency tracked by a communications adaptive frequency control AFC device and the temperature compensation value, and use the frequency control signal to control an oscillation frequency of the crystal oscillation circuit unit 101 to work on the frequency tracked by the communications AFC device.

In the embodiment of the present invention, the crystal oscillator 100 obtains the temperature difference between the measured temperature of the temperature sensor and the reference temperature, and determines the temperature compensation value according to the temperature difference and a coefficient of the temperature-frequency curve to control the oscillation frequency of the crystal oscillation circuit unit, thereby achieving a temperature compensation result to specific precision at a low cost.

The technical solution adopted by the crystal oscillator 100 according to the embodiment of the present invention may be applied to a variety of crystal oscillators, for example, a digital-controlled crystal oscillator, a voltage-controlled crystal oscillator, and the like; and the present invention sets no limit thereto.

Further, the oscillation controlling unit 105 may specifically determine an AFC control value according to the frequency tracked by the AFC device and a frequency corresponding to the temperature compensation value, and generate the frequency control signal according to the AFC control value and the temperature compensation value.

In the embodiment of the present invention, the AFC control value has different representation forms based on different types of crystal oscillators. For example, in a digital-controlled crystal oscillator, the AFC control value may be a numerical signal; in a voltage-controlled crystal oscillator, the AFC control value may be a voltage value, and so on. Although the representation forms of the AFC control value are different, the uses are basically the same; the AFC control values are all used together with the temperature compensation value to generate the frequency control signal, thereby controlling a frequency of the crystal oscillation circuit.

Figure 2:
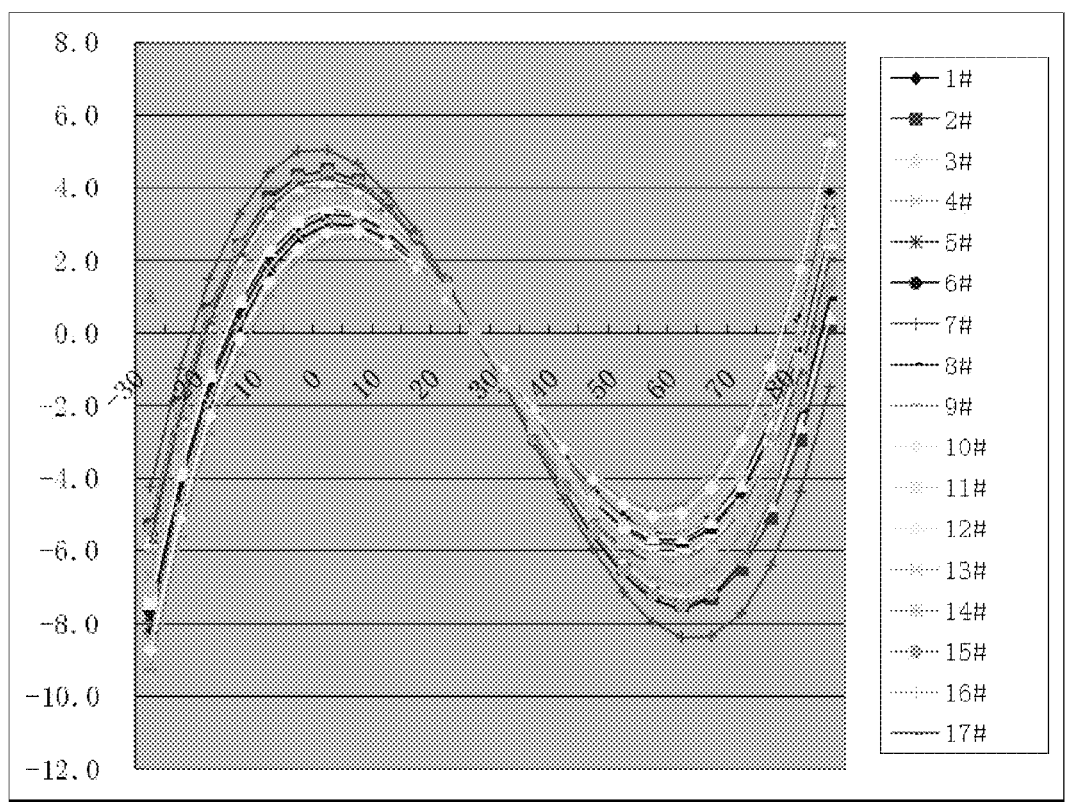
FIG. 2 is a schematic diagram of a temperature-frequency curve according to an embodiment of the present invention.

In the embodiment of the present invention, a variation relationship between crystal frequencies of the crystal oscillator 100 and temperatures may be represented by using a temperature-frequency curve. FIG. 2 is a schematic temperature-frequency curve of measurement results of 20 standard packaged crystal oscillators (SPXOs) of the same batch according to the embodiment of the present invention. In FIG. 2, a change in an oscillation frequency within an operating temperature range is measured by using 25° C. as a reference. In FIG. 2, in the temperature-frequency curve shown in FIG. 2, a horizontal axis represents a temperature in Celsius (° C.), a vertical axis is a frequency variation in parts per million (ppm). For example, a variation 2 ppm for a frequency 10

MHz indicates that a variation is 2 Hz. Certainly, the temperature-frequency curve also has other representation forms where, for example, the horizontal axis represents a temperature while the vertical axis represents a frequency. The present invention sets no limit thereto.

The temperature-frequency curve of the crystal oscillator 100 may be represented by using a cubic polynomial equation as follows:

$$FT(T) = \frac{\Delta f}{f_0}(T) = a3 \cdot (T-T_0)^3 + a2 \cdot (T-T_0)^2 + a1 \cdot (T-T_0) + a0 \quad (1)$$

where $T_0$ is a reference temperature, T is an actual temperature, a0, a1, a2, and a3 are coefficients of the polynomial equation. Because crystals and related oscillation circuits are discrete, the coefficients of the polynomial equation are different for each crystal oscillator.

Assuming a random temperature $T_c$, the foregoing equation may be converted into:

$$FT(T) = \frac{\Delta f}{f_0}(T) = a3 \cdot (T - T_c + T_c - T_0)^3 + a2 \cdot (T - T_c + T_c - T_0)^2 + $$
$$a1 \cdot (T - T_c + T_c - T_0) + a0$$
$$= a3 \cdot [(T-T_c)^3 + 3 \cdot (T-T_c)^2 + 3 \cdot (T-T_c) + 1] +$$
$$a2 \cdot [(T-T_c)^2 + 2 \cdot (T_c - T_0) + 1] + a1 \cdot$$
$$[(T-T_c) + (T_c - T_0)] + a0$$
$$= a3 \cdot (T-T_c)^3 + (3 \cdot a3 + a2)(T-T_c)^2 + (3 \cdot a3 + 2 \cdot a2 +$$
$$a1)(T-T_c) + a3 + a2 + a1 \cdot (T_c - T_0) + a0$$

In other words, the temperature variation of the crystal frequency of the crystal oscillator 100 may be represented by using a cubic polynomial equation of a difference between the temperature T and any temperature. That is, the reference temperature $T_0$ may be a value within a temperature range allowed by the crystal oscillator 100.

Inevitably, there is an error between T and a measured value $\hat{T}$ thereof. The error between T and the measured value $\hat{T}$ thereof may be represented by using a polynomial equation. However, a higher order term coefficient of the polynomial equation is very small and has very little impact on the value of the polynomial equation. For ease of analysis, the polynomial equation may be simplified into a linear relationship, as shown in equation (2):

$$T \approx k(\hat{T} - \Delta T) \quad (2)$$

where k is a gain error.

Substitute equation (2) into the temperature and frequency variation equation (1) to get:

$$FT(T) = \frac{\Delta f}{f_0}(T) = a3 \cdot (T-T_0)^3 + a2 \cdot (T-T_0)^2 + a1 \cdot (T-T_0) + a0 \quad (3)$$
$$= k^3 \cdot a3 \cdot (\hat{T} - \Delta T - \hat{T}_0 + \Delta T_0)^3 + k^2 \cdot a2 \cdot$$
$$(\hat{T} - \Delta T - \hat{T}_0 + \Delta T_0)^2 + k \cdot a1 \cdot (\hat{T} - \Delta T - \hat{T}_0 + \Delta T_0) + a0$$
$$= k^3 \cdot a3 \cdot (\hat{T} - \hat{T}_0)^3 + (k^2 a2 - 3 \cdot k^3 \cdot a3 \cdot (\Delta T - \Delta T_0)) \cdot (\hat{T} - \hat{T}_0)^2 +$$
$$(k \cdot a1 - 2 \cdot k^2 \cdot a2 \cdot (\Delta T - \Delta T_0) + 3 \cdot k^3 \cdot a3 \cdot (\Delta T - \Delta T_0)^2) \cdot$$
$$(\hat{T} - \hat{T}_0) + (a0 - k \cdot a1 \cdot (\Delta T - \Delta T_0) + k^2 \cdot a2 \cdot (\Delta T - \Delta T_0)^2 -$$
$$k^3 \cdot a3 \cdot (\Delta T - \Delta T_0)^3)$$

where $\hat{T}_0 = T_0/k + \Delta T_0$ is a measured value of $T_0$.

According to equation (3), the temperature-frequency curve of the crystal oscillator still can be fitted by using a polynomial equation with $\hat{T}$ as an independent variable. If equation (2) is represented by using a polynomial equation, a polynomial equation of the temperature-frequency curve of the crystal oscillator having a higher order with $\hat{T}$ as an independent variable is obtained after equation (1) is substituted in. Because the higher order coefficient thereof is very small, has very little impact on the precision of the temperature-frequency curve, and may be ignored, the polynomial equation may be simplified as a polynomial equation cubic curve for fitting.

Further, according to equation (3), a frequency corresponding to the temperature compensation value may be determined by using a temperature difference between a subsequent measured temperature of the temperature sensor and the set reference temperature. One frequency corresponds to one temperature compensation value; therefore, the temperature compensation value corresponding to the frequency may be determined. If the crystal oscillator is a digital-controlled crystal oscillator, the temperature compensation value may be a control value, that is, the frequency corresponds one to one to the control value. If the crystal oscillator is a voltage-controlled crystal oscillator, the temperature compensation value may be a voltage value, that is, the frequency corresponds one to one to the voltage value. Certainly, the cases where the method according to the embodiment of the present invention is applied to a crystal oscillator of another type cannot be excluded.

In an embodiment of the present invention, firstly, coefficients (a3, a2, a1, a0) of a default temperature-frequency curve are defined for crystal oscillators of the same batch. Then, a sample value $(T_0, F_0)$ at room temperature $(T_0)$ is obtained by common frequency calibration in a production line, where $F_0$ is a size of a control signal when the crystal oscillator works on an accurate frequency at $T_0$. The temperature $T_0$ is substituted into a cubic polynomial equation of the temperature frequency control signal curve to obtain the coefficient a0. Then, a first temperature frequency control signal curve cubic polynomial equation is obtained, where the polynomial equation satisfies frequency precision requirements within a specific temperature range $[T_-, T_+]$, where $T_-$ is a minimum temperature satisfying the frequency precision requirements while $T_+$ is a maximum temperature satisfying the frequency precision requirements.

Alternatively, the crystal oscillator 100 may further include a sample obtaining unit 106 and a calibrating unit 107.

The sample obtaining unit 106 may be configured to, when the oscillation frequency of the crystal oscillation circuit unit works stably on the frequency tracked by the communications AFC device, collect the measured temperature or the temperature difference as a temperature parameter of a sample, and collect the frequency control signal or the frequency tracked by the communications AFC device as a frequency parameter of the sample.

The calibrating unit 107 may be configured to calibrate the coefficient of the temperature-frequency curve according to samples collected by the sample obtaining unit 106 multiple times, and send the coefficient of the temperature-frequency curve to the temperature compensating unit 104, where the coefficient of the temperature-frequency curve is used to determine the temperature-frequency curve.

According to equation (1) or equation (3), the temperature-frequency curve involves two parameters, that is, a temperature parameter and a frequency parameter.

When the reference temperature is known, either the measured temperature of the temperature sensor unit 102 or the relative temperature of the relative temperature calculating unit 103 may be used as the temperature parameter of the sample for fitting the coefficient of the temperature-frequency curve.

The frequency control signal generated by the oscillation controlling unit 105 is for the final purpose of enabling the oscillation frequency of the crystal oscillation circuit unit 101 to work on the frequency tracked by the communications AFC device, where one frequency control signal corresponds to one frequency value. In essence, the sample obtaining unit 106 obtains the frequency control signal to obtain the frequency tracked by the communications AFC device. Therefore, the sample obtaining unit 106 may use the frequency control signal or the frequency tracked by the communications AFC device as the frequency parameter of the sample. The present invention uses the measured temperature and the frequency control signal as an example of the temperature parameter and the frequency parameter of the sample; however, the technical solution of the present invention may accept the relative temperature as the temperature parameter of the sample, or accept the frequency tracked by the communications AFC device as the frequency parameter of the sample. The present invention sets not limit thereto.

In an embodiment of the present invention, if the operating temperature of the crystal oscillator is beyond the temperature range $[T_-, T_+]$ determined by frequency calibration in the production line, samples are obtained to implement calibration of the coefficient of the temperature-frequency curve. The embodiment of the present invention describes the method of the present invention by using an example where the crystal oscillator is applied to a terminal; however, the crystal oscillator according to the embodiment of the present invention is not limited to the application of the terminal.

When the terminal is powered on, as long as a temperature is within a range $[T_-, T_+]$, a crystal oscillator of the terminal itself may use a temperature compensation value obtained according to a coefficient of a default temperature-frequency curve to search for a network. If the temperature exceeds the range $[T_-, T_+]$ when the terminal is powered on, the temperature compensation value is not obtained directly by using the coefficient of the default temperature-frequency curve; instead, a method of multiple attempts is adopted to set a temperature compensation value to search for a network, where the temperature compensation value is a frequency value corresponding to a frequency control signal in the embodiment of the present invention.

The terminal starts normal operation once the network is found, and automatically tracks a frequency of a base station to enter a self-calibration process. The so-called self-calibration refers to that in a subsequent process of using the terminal, the terminal uses the frequency of the base station as a reference to measure a frequency variation value of a crystal oscillator thereof. In such a case, temperature and frequency values are collected in real time as a new sample for participating in the fitting of the temperature-frequency curve. A specific process is as follows.

When the terminal determines that the frequency of the base station is locked by adjusting an AFC control value, a measured temperature and a frequency control signal of the crystal oscillator in such a case are collected. Because the frequency control signal is determined according to the temperature compensation value and the AFC control value and corresponds to the frequency of the base station, (temperature, frequency control signal) may be used as an obtained sample. As the terminal continues to work, the sample obtaining unit keeps obtaining new samples, and the coefficient of the temperature-frequency curve may be calibrated according to the samples collected multiple times.

The method of obtaining a (temperature, frequency control signal) sample by self-calibration according to the embodiment of the present invention, compared with the method of obtaining a sample in a laboratory, greatly reduces a cost for determining a coefficient of a temperature-frequency curve.

Further, in the embodiment of the present invention, the calibrating unit 107 may specifically fit, by using a least square method, the samples collected by the sample obtaining unit multiple times, thereby calibrating the coefficient of the temperature-frequency curve.

Because the frequency of the base station tracked by the terminal is affected by attenuation, noise, and Doppler frequency shift of a radio transmission channel, a frequency error is great. In order to solve the problem, a least square method may be adopted to fit the samples.

A relationship between a temperature x, a coefficient a, and a frequency control signal y obtained according to the least square method is as follows:

$$\sum_{k=0}^{n}\left(\sum_{i=0}^{m} x_i^{j+k}\right) a_k = \sum_{i=0}^{m} x_i^j y_i \quad (4)$$

$$j = 0, 1, \ldots, n$$

where n is the number of orders of a polynomial equation. In the embodiment, n=3. m+1 is the number of samples. With a storage space and a calculation bit width being taken into consideration, a value of m cannot be too big. According to the number of orders of the polynomial equation, it can be known that a minimum value of the number of samples m+1 is the number of orders of the polynomial equation+1, that is, a minimum value of m is 3. A matrix is represented as follows:

$$\begin{bmatrix} m+1 & \sum_{i=0}^{m} x_i & \cdots & \sum_{i=0}^{m} x_i^n \\ \sum_{i=0}^{m} x_i & \sum_{i=0}^{m} x_i^2 & \cdots & \sum_{i=0}^{m} x_i^{n+1} \\ \cdots & \cdots & \cdots & \cdots \\ \sum_{i=0}^{m} x_i^n & \sum_{i=0}^{m} x_i^{n+1} & \cdots & \sum_{i=0}^{m} x_i^{2n} \end{bmatrix} \begin{bmatrix} a_0 \\ a_1 \\ \vdots \\ a_n \end{bmatrix} = \begin{bmatrix} \sum_{i=0}^{m} y_i \\ \sum_{i=0}^{m} x_i y_i \\ \vdots \\ \sum_{i=0}^{m} x_i^n y_i \end{bmatrix} \quad (5)$$

A temperature matrix A is:

$$A = \begin{bmatrix} m+1 & \sum_{i=0}^{m} x_i & \cdots & \sum_{i=0}^{m} x_i^n \\ \sum_{i=0}^{m} x_i & \sum_{i=0}^{m} x_i^2 & \cdots & \sum_{i=0}^{m} x_i^{n+1} \\ \cdots & \cdots & \cdots & \cdots \\ \sum_{i=0}^{m} x_i^n & \sum_{i=0}^{m} x_i^{n+1} & \cdots & \sum_{i=0}^{m} x_i^{2n} \end{bmatrix} \quad (6)$$

Resolve A to obtain an equation:

$$A = \begin{pmatrix} l_{11} & & & \\ l_{21} & l_{22} & & \\ \vdots & \vdots & \ddots & \\ l_{n+11} & l_{n+12} & \cdots & l_{n+1n+1} \end{pmatrix} \begin{pmatrix} l_{11} & l_{21} & \cdots & l_{n+11} \\ & l_{22} & \cdots & l_{n+12} \\ & & \ddots & \vdots \\ & & & l_{n+1n+1} \end{pmatrix} \quad (7)$$

The frequency control signal y may be represented as:

$$\begin{bmatrix} b_1 \\ b_2 \\ \vdots \\ b_{n+1} \end{bmatrix} = \begin{bmatrix} \sum_{i=0}^{m} y_i \\ \sum_{i=0}^{m} x_i y_i \\ \vdots \\ \sum_{i=0}^{m} x_i^n y_i \end{bmatrix} \quad (8)$$

Then:

$$\text{tmp}_i = \left(b_i - \sum_{k=1}^{i-1} l_{ik} \text{tmp}_k\right) \Big/ l_{ii} (i = 1, 2, \ldots, n+1) \quad (9)$$

$$a_i = \left(\text{tmp}_{i+1} - \sum_{k=i+2}^{n+1} l_{ki} a_k\right) \Big/ l_{i+1\,i+1} (i = n, n-1, \ldots, 1, 0) \quad (10)$$

A fitted coefficient of the polynomial equation may be obtained.

The embodiment of the present invention fits samples by using a least square method, which can improve precision of a temperature compensation value determined according to a temperature-frequency curve to a certain extent.

Figure 3:
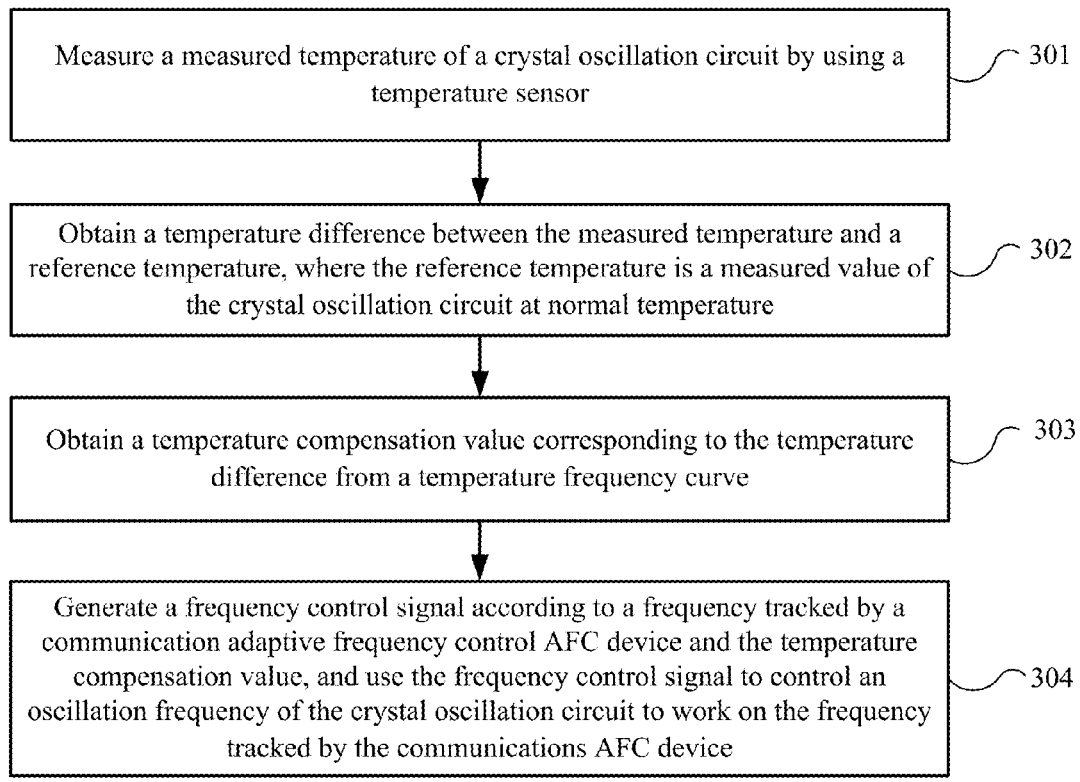
FIG. 3 is a flowchart of a temperature compensation method according to an embodiment of the present invention.

FIG. 3 is a flowchart of a method according to an embodiment of the present invention. The method illustrated in FIG. 3 is executed by a crystal oscillator.

301. Measure a measured temperature of a crystal oscillation circuit by using a temperature sensor.

302. Obtain a temperature difference between the measured temperature and a reference temperature. The reference temperature is a measured value of the crystal oscillation circuit at normal temperature.

303. Obtain a temperature compensation value corresponding to the temperature difference from a temperature-frequency curve.

304. Generate a frequency control signal according to a frequency tracked by a communications adaptive frequency control AFC device and the temperature compensation value, and use the frequency control signal to control an oscillation frequency of the crystal oscillation circuit to work on the frequency tracked by the communications AFC device.

In the embodiment of the present invention, one measured temperature of the temperature sensor is used as the reference temperature, and the temperature compensation value is determined according to the temperature difference between a subsequent measured temperature and the reference temperature as well as the coefficient of the temperature-frequency curve to control the oscillation frequency of the crystal oscillation circuit, thereby achieving a temperature compensation result to specific precision at a low cost.

Further, the generating a frequency control signal according to a frequency tracked by a communications adaptive frequency control AFC device and the temperature compensation value may specifically include:

determining an AFC control value according to the frequency tracked by the AFC device and a frequency corresponding to the temperature compensation value, and generating the frequency control signal according to the AFC control value and the temperature compensation value.

Alternatively, if the oscillation frequency of the crystal oscillation circuit works stably on the frequency tracked by the communications AFC device, the measured temperature or the temperature difference may be collected as a temperature parameter of a sample, and the frequency control signal or the frequency tracked by the AFC device may be collected as a frequency parameter of the sample; and the coefficient of the temperature-frequency curve may be calibrated according to samples collected multiple times, where the coefficient of the temperature-frequency curve is used to determine the temperature-frequency curve.

Further, the calibrating the coefficient of the temperature-frequency curve according to the samples collected multiple times may specifically include: fitting, by using a least square method, the samples collected by the sample obtaining unit multiple times, thereby calibrating the coefficient of the temperature-frequency curve.

A person of ordinary skill in the art may be aware that, in combination with the examples described in the embodiments disclosed in this specification, units and algorithm steps may be implemented by electronic hardware, or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, a detailed working process of the foregoing system, apparatus, and unit may refer to the corresponding process in the foregoing method embodiments, and the details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, multiple units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on multiple network units. A part or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of the present invention essentially, or the part contributing to the prior art, or a part of the technical solutions may be implemented in a form of a software product. The computer software product is stored in a storage medium, and includes several instructions for instructing a computer device (which may be a personal computer, a server, or a network device) to perform all or a part of the steps of the methods described in the embodiments of the present invention. The foregoing storage medium includes: any medium that can store program codes, such as a USB flash disk, a removable hard disk, a read-only memory (Read-Only Memory, ROM), a random access memory (Random Access Memory, RAM), a magnetic disk, or an optical disc.

The foregoing descriptions are merely specific embodiments of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A crystal oscillator, comprising a crystal oscillation circuit unit, a temperature sensor unit, an oscillation controlling unit, a relative temperature calculating unit, and a temperature compensating unit, wherein
the temperature sensor unit is configured to measure a temperature of the crystal oscillation circuit unit;
the relative temperature calculating unit is configured to obtain a temperature difference between the measured temperature and a reference temperature, wherein the reference temperature is a measured value of the crystal oscillation circuit unit at a normal temperature,
the temperature compensating unit is configured to obtain a temperature compensation value corresponding to the temperature difference from a temperature-frequency curve; and
the oscillation controlling unit is configured to, according to a first frequency tracked by a communications adaptive frequency control (AFC) device and the temperature compensation value, generate a frequency control signal, and use the frequency control signal to control an oscillation frequency of the crystal oscillation circuit unit to work on the first frequency tracked by the communications AFC device.

2. The crystal oscillator according to claim 1, wherein the oscillation controlling unit is configured to determine an AFC control value according to the frequency tracked by the communications AFC device and a second frequency corresponding to the temperature compensation value, and generate the frequency control signal according to the AFC control value and the temperature compensation value.

3. The crystal oscillator according to claim 1, further comprising:
a sample obtaining unit, configured to, when the oscillation frequency of the crystal oscillation circuit unit works stably on the first frequency tracked by the communications AFC device, collect the measured temperature or the temperature difference as a temperature parameter of a sample, and collect the frequency control signal or the first frequency tracked by the communications AFC device as a frequency parameter of the sample; and
a calibrating unit, configured to calibrate a coefficient of the temperature-frequency curve according to samples collected by the sample obtaining unit for multiple times.

4. The crystal oscillator according to claim 3, wherein the calibrating unit fits, by using a least square method, the samples collected by the sample obtaining unit for multiple times, to calibrate the coefficient of the temperature-frequency curve.

5. A temperature compensation method, comprising:
measuring a temperature of a crystal oscillation circuit by using a temperature sensor;
obtaining a temperature difference between the measured temperature and a reference temperature, wherein the reference temperature is a measured value of the crystal oscillation circuit at a normal temperature;
obtaining a temperature compensation value corresponding to the temperature difference from a temperature-frequency curve; and
according to a first frequency tracked by a communications adaptive frequency control (AFC) device and the temperature compensation value, generating a frequency control signal, and using the frequency control signal to control an oscillation frequency of the crystal oscillation circuit to work on the first frequency tracked by the communications AFC device.

6. The method according to claim 5, wherein the generating the frequency control signal according to the first frequency tracked by the communications adaptive frequency control (AFC) device and the temperature compensation value comprises:
determining an AFC control value according to the first frequency tracked by the communications AFC device and a second frequency corresponding to the temperature compensation value; and
generating the frequency control signal according to the AFC control value and the temperature compensation value.

7. The method according to claim 5, further comprising:
if the oscillation frequency of the crystal oscillation circuit works stably on the frequency tracked by the communications AFC device, collecting the measured temperature or the temperature difference as a temperature parameter of a sample, and collecting the frequency control signal or the first frequency tracked by the communications AFC device as a frequency parameter of the sample; and
calibrating a coefficient of the temperature-frequency curve according to samples collected for multiple times.

8. The method according to claim 7, wherein the calibrating the coefficient of the temperature-frequency curve according to the samples collected for multiple times comprises:
fitting, by using a least square method, the samples collected for multiple times, to calibrate the coefficient of the temperature-frequency curve.

9. The crystal oscillator according to claim 1, wherein when the crystal oscillator is a digital-controlled crystal oscillator, the AFC control value is a numerical signal.

10. The crystal oscillator according to claim 1, wherein when the crystal oscillator is a voltage-controlled crystal oscillator, the AFC control value is a voltage value.

11. A temperature compensation system, comprising: a communications adaptive frequency control (AFC) device and a crystal oscillator, wherein
the communications AFC device is configured to track a first frequency; and
the crystal oscillator comprises a crystal oscillation circuit unit, a temperature sensor unit, an oscillation controlling unit, a relative temperature calculating unit, and a temperature compensating unit, wherein
the temperature sensor unit is configured to measure a temperature of the crystal oscillation circuit unit;
the relative temperature calculating unit is configured to obtain a temperature difference between the measured temperature and a reference temperature, wherein the reference temperature is a measured value of the crystal oscillation circuit unit at a normal temperature, the temperature compensating unit is configured to obtain a temperature compensation value corresponding to the temperature difference from a temperature-frequency curve; and the oscillation controlling unit is configured to, according to the first frequency tracked by the communications AFC device and the temperature compensation value, generate a frequency control signal, and use the frequency control signal to control an oscillation frequency of the crystal oscillation circuit unit to work on the first frequency tracked by the communications AFC device.

12. The system according to claim 11, wherein the oscillation controlling unit is configured to determine an AFC control value according to the frequency tracked by the communications AFC device and a second frequency corresponding to the temperature compensation value, and generate the frequency control signal according to the AFC control value and the temperature compensation value.

13. The system according to claim 11, further comprising:

a sample obtaining unit, configured to, when the oscillation frequency of the crystal oscillation circuit unit works stably on the first frequency tracked by the communications AFC device, collect the measured temperature or the temperature difference as a temperature parameter of a sample, and collect the frequency control signal or the first frequency tracked by the communications AFC device as a frequency parameter of the sample; and a calibrating unit, configured to calibrate a coefficient of the temperature-frequency curve according to samples collected by the sample obtaining unit for multiple times.

14. The system according to claim 13, wherein the calibrating unit fits, by using a least square method, the samples collected by the sample obtaining unit for multiple times, to calibrate the coefficient of the temperature-frequency curve.

* * * * *